US012626886B2

(12) United States Patent
Morita et al.

(10) Patent No.: US 12,626,886 B2
(45) Date of Patent: May 12, 2026

(54) MULTI CHARGED PARTICLE BEAM WRITING APPARATUS

(71) Applicant: NuFlare Technology, Inc., Yokohama (JP)

(72) Inventors: Hirofumi Morita, Yokohama (JP); Haruyuki Nomura, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 384 days.

(21) Appl. No.: 18/509,474

(22) Filed: Nov. 15, 2023

(65) Prior Publication Data

US 2024/0242933 A1 Jul. 18, 2024

Related U.S. Application Data

(63) Continuation of application No. PCT/JP2023/000964, filed on Jan. 16, 2023.

(51) Int. Cl.
*H01J 37/317* (2006.01)
*H01J 37/04* (2006.01)
(Continued)

(52) U.S. Cl.
CPC ........ *H01J 37/3177* (2013.01); *H01J 37/045* (2013.01); *H01J 37/141* (2013.01); *H01J 37/145* (2013.01)

(58) Field of Classification Search
CPC ...... H01J 37/045; H01J 37/141; H01J 37/145; H01J 37/3174; H01J 37/3177; H01J 2237/14; H01J 2237/1405
See application file for complete search history.

(56) References Cited

U.S. PATENT DOCUMENTS

| 8,049,189 B2 | 11/2011 | Buschbeck et al. |
| 8,129,698 B2 | 3/2012 | Nakayamada et al. |

(Continued)

FOREIGN PATENT DOCUMENTS

| JP | 61-101944 A | 5/1986 |
| JP | 2009-512973 A | 3/2009 |

(Continued)

OTHER PUBLICATIONS

Taiwanese Office Action issued Apr. 19, 2024, in Taiwanese Patent Application No. 112130065 (with unedited computer-generated English Translation), 6 pages.

(Continued)

*Primary Examiner* — David E Smith
(74) *Attorney, Agent, or Firm* — Oblon, McClelland, Maier & Neustadt, L.L.P.

(57) ABSTRACT

A multi charged particle beam writing apparatus includes two or more-stage objective lenses each comprised of a magnetic lens, and configured to focus the beam on a substrate, n ($n \geq 3$) correction lenses correcting an imaging state of the multi charged particle beam, and an electric field control electrode to which a positive constant voltage with respect to the substrate is applied. The electric field control electrode generates an electric field between the substrate and the electrode. The objective lenses include a first objective lens, and a second objective lens placed most downstream in a travel direction of the beam. m ($n \geq m \geq 1$) correction lenses of the n correction lenses are magnetic correction lenses placed in a lens magnetic field of the second objective lens. (n−m) correction lenses are placed upstream of the lens magnetic field of the second objective lens in the travel direction.

10 Claims, 8 Drawing Sheets

(51) Int. Cl.
H01J 37/141 (2006.01)
H01J 37/145 (2006.01)

(56) References Cited

U.S. PATENT DOCUMENTS

| | | | |
|---|---|---|---|
| 8,927,941 | B2 | 1/2015 | Touya et al. |
| 9,343,266 | B2 | 5/2016 | Ogasawara et al. |
| 9,373,424 | B2 | 6/2016 | Touya et al. |
| 10,451,976 | B2 | 10/2019 | Ogasawara |
| 10,998,164 | B2 | 5/2021 | Touya et al. |
| 2013/0240750 | A1* | 9/2013 | Touya .................... B82Y 10/00 |
| | | | 250/396 R |
| 2018/0138012 | A1 | 5/2018 | Iizuka et al. |
| 2022/0384142 | A1 | 12/2022 | Nomura et al. |
| 2022/0399181 | A1 | 12/2022 | Kimura et al. |
| 2023/0005711 | A1 | 1/2023 | Nanao et al. |
| 2023/0102923 | A1 | 3/2023 | Nomura et al. |

FOREIGN PATENT DOCUMENTS

| | | | |
|---|---|---|---|
| JP | 2009-260250 | A | 11/2009 |
| JP | 2013-191841 | A | 9/2013 |
| JP | 2013-197289 | A | 9/2013 |
| JP | 2014-49545 | A | 3/2014 |
| JP | 2018-170435 | A | 11/2018 |
| JP | 2019-212766 | A | 12/2019 |
| JP | 2021-180224 | A | 11/2021 |
| JP | 2022-177801 | A | 12/2022 |
| TW | 201546864 | A | 12/2015 |
| TW | 201611073 | A | 3/2016 |
| TW | 202135114 | A | 9/2021 |
| WO | WO-2021100463 | A1 * | 5/2021 |

OTHER PUBLICATIONS

International Search Report issued Mar. 28, 2023 in PCT/JP2023/000964 filed on Jan. 16, 2023, 4 pages (with English Translation of Categories of Cited Documents).

* cited by examiner

Fig.2
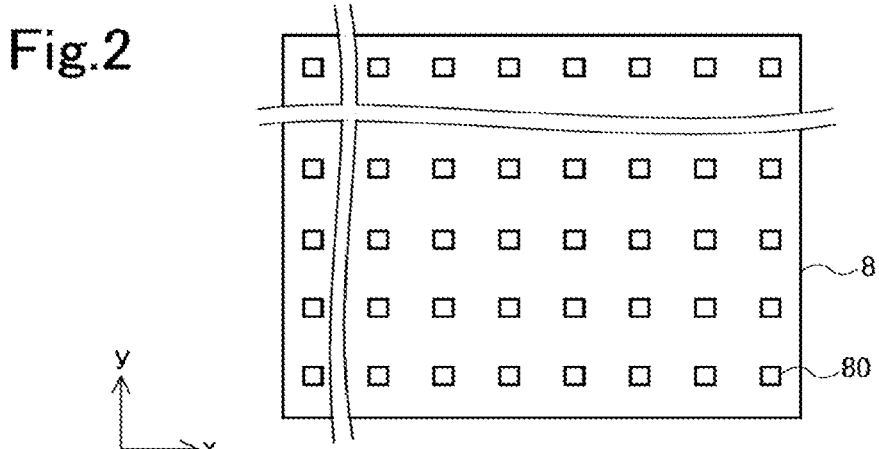
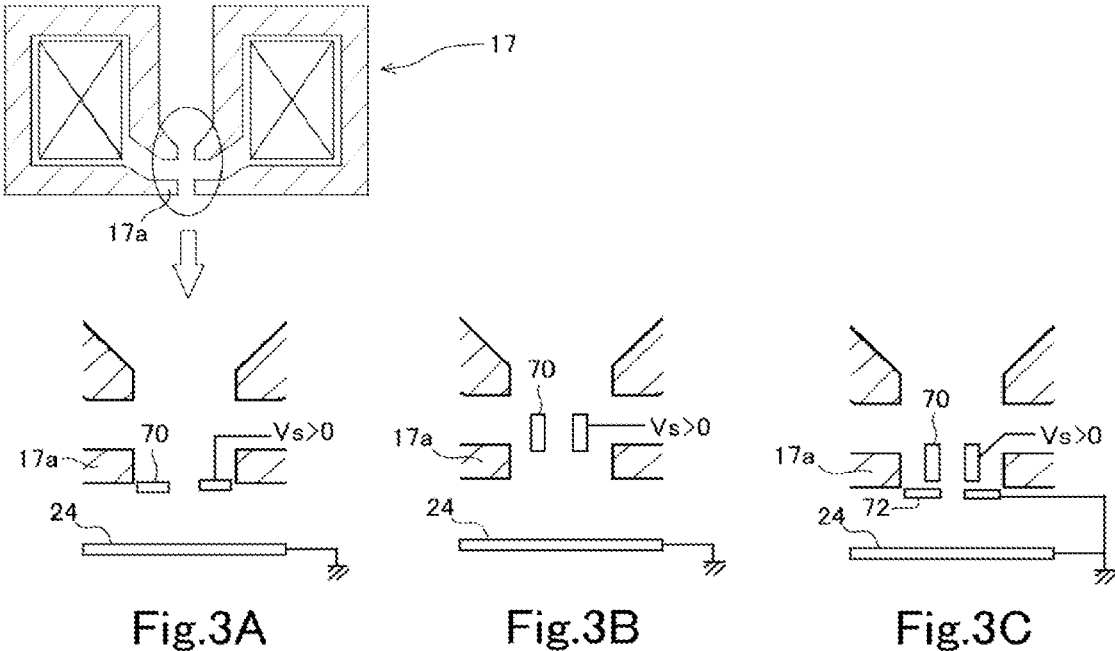
Fig.3A          Fig.3B          Fig.3C

Fig.4A    Fig.4B    Fig.4C

MULTI CHARGED PARTICLE BEAM WRITING APPARATUS

TECHNICAL FIELD

The present invention relates to a multi charged particle beam writing apparatus.

BACKGROUND ART

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern formed on a quartz is employed. A so-called electron beam lithography technique, in which a pattern is formed by exposing a resist using an electron beam writing apparatus, is used to produce a highly precise original image pattern.

As an electron beam writing apparatus, a writing apparatus using a multi-beam is under active development, which substitutes for a conventional single beam writing apparatus that deflects a single beam and radiates the beam to a desired position on a sample. Use of a multi-beam allows many beams to be radiated as compared to when writing is performed with a single electron beam, thus the throughput can be significantly improved. In a writing apparatus using a multi-beam method, for example, an electron beam emitted from an electron source is passed through a shaping aperture array member having a plurality of openings to form a multi-beam, blanking control is performed on beams by a blanking aperture array substrate, and unblocked beams are reduced by an optical system, and radiated to a sample placed on a movable stage.

In the electron beam writing apparatus, beams in each shot are focused on a sample by an objective lens, dynamic focus correction (dynamic focus) is performed during writing using, for example, an electrostatic lens so as to correspond to the irregularities of the sample surface, and the position (imaging height) in the optical axis direction of the multi-beam array image is corrected. Here, the optical axis refers to the central axis of an optical system in the course from emission of an electron beam to irradiation of the sample.

However, when dynamic focus is performed, rotation and magnification change occur in the beam array image on the sample, and the writing positional accuracy deteriorates. Thus, the rotation and magnification change of the beam array image due to the dynamic focus is required to be reduced as much as possible.

In order to reduce the rotation and magnification change of the beam array image due to the dynamic focus, a multi beam writing apparatus has been proposed, in which three electrostatic lenses are provided, and at least one electrostatic lens is placed in the lens magnetic field of each of two-stage objective lenses (see, for example, PTL 1).

When a sample is irradiated with an electron beam, secondary electrons are generated from the sample. The secondary electrons return to the sample surface, and a wide area of the resist on the sample surface is charged, thus a position displaced from a target position may be irradiated with the electron beam.

A technique has been proposed (see, for example, PTL 2) in which an electric field to move secondary electrons back to a lower position (in the sample surface direction) is generated, and a charge area is restricted by returning the secondary electrons to the vicinity of the secondary electron generation position (beam irradiation position) so as to improve the accuracy of correction to beam position change due to resist charging. However, with this technique, improvement of the accuracy of beam irradiation position is limited because the amount of charge on the resist surface increases. In general, for a finer pattern, the sensitivity of a corresponding resist tends to decrease. Therefore, when a pattern is made finer, the amount of beam irradiation to the resist increases, and the amount of charge of the resist increases, thus it gets more difficult to achieve a required positional accuracy.

It is practiced that an electrostatic lens is operated in a positive voltage range with respect to a sample surface (see, for example, PTL 3). Using this technique, a lifting electric field is generated, by which secondary electrons are guided upward from the sample surface, thus the amount of charge of the resist can be reduced.

However, there is a problem in that the voltage applied to the electrostatic lens changes corresponding to a sample surface height during writing, thus the lifting electric field is not constant, and the amount of charge of the resist changes, which prevents the improvement of the accuracy of beam irradiation position on the entire writing region.

CITATION LIST

Patent Literature

PTL 1: JP 2013-197289 A
PTL 2: JP 2021-180224 A
PTL 3: JP 2013-191841 A

SUMMARY OF INVENTION

It is an object of the present invention to provide a multi charged particle beam writing apparatus that can generate a constant electric field to lift secondary electrons and improve the writing accuracy.

According to one aspect of the present invention, a multi charged particle beam writing apparatus includes a plurality of blankers performing blanking deflection on each of beams in a multi charged particle beam, a limiting aperture member blocking a beam in the multi charged particle beam, the beam being deflected by the blanker to achieve a beam-off state, two or more-stage objective lenses each comprised of a magnetic lens, and configured to focus the multi charged particle beam on a substrate, which has passed through the limiting aperture member, n (n is an integer greater than or equal to three) correction lenses correcting an imaging state of the multi charged particle beam on the substrate, and an electric field control electrode to which a positive constant voltage with respect to the substrate is applied, the electric field control electrode generating an electric field between the substrate and the electric field control electrode, wherein the two or more-stage objective lenses include a first objective lens, and a second objective lens placed most downstream in a travel direction of the multi charged particle beam, m (m is an integer such that $n \geq m \geq 1$) correction lenses of the n correction lenses are magnetic correction lenses placed in a lens magnetic field of the second objective lens, and (n−m) correction lenses that are the n correction lenses other than the magnetic correction lenses are placed upstream of the lens magnetic field of the second objective lens in the travel direction of the multi charged particle beam.

Advantageous Effects of Invention

According to the present invention, a constant electric field to lift secondary electrons can be generated and the writing accuracy can be improved.

BRIEF DESCRIPTION OF DRAWINGS

FIG. 2 is a schematic diagram of a shaping aperture array substrate.

FIG. 3A to FIG. 3C are views illustrating the configuration of an electric field control electrode.

FIG. 4A to FIG. 4C are views illustrating the configuration of an acceleration lens.

DESCRIPTION OF EMBODIMENTS

Hereinafter, an embodiment of the present invention will be described based on the drawings.

Figure 1:
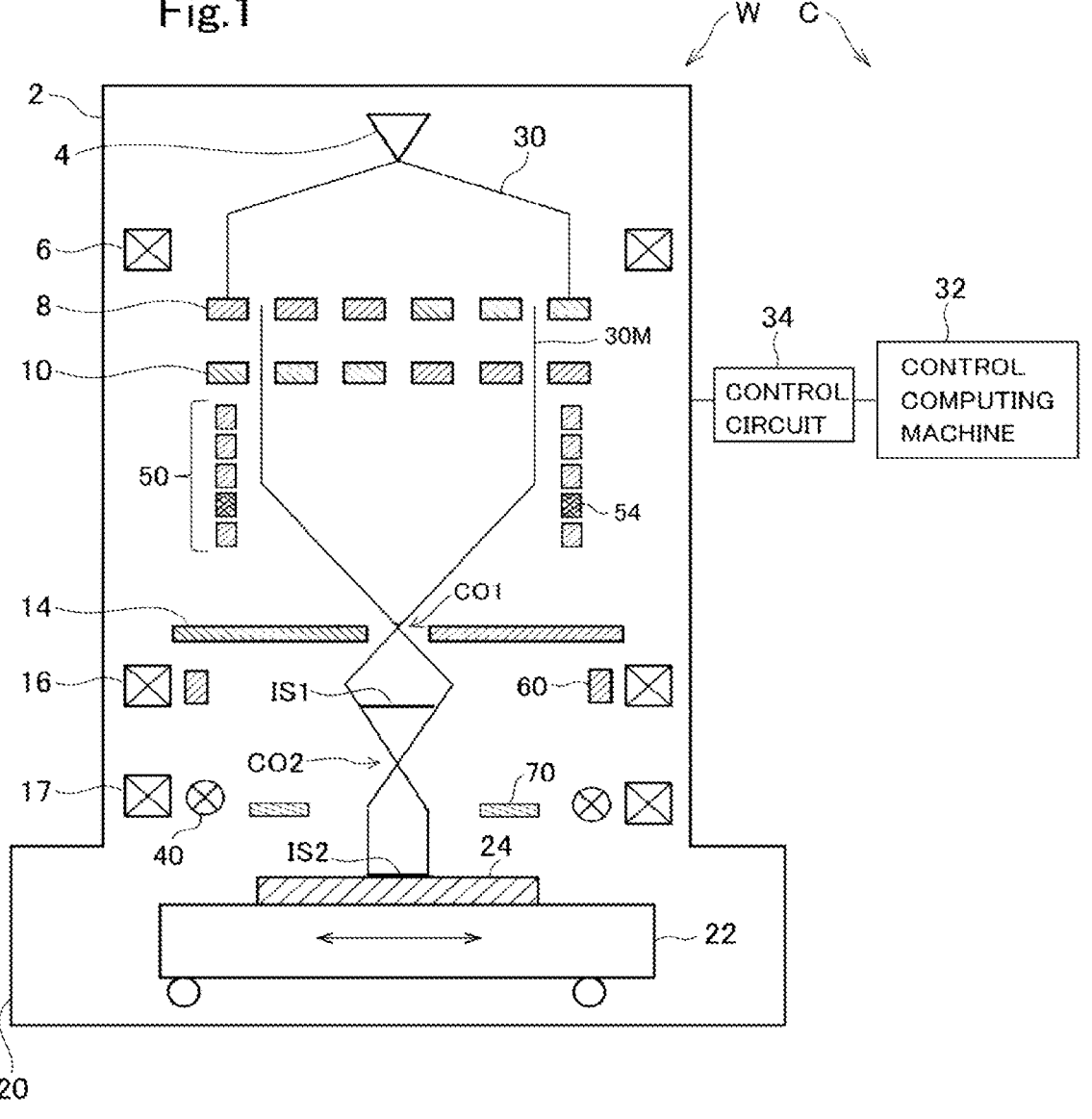
FIG. 1 is a schematic diagram of a multi charged particle beam writing apparatus according to an embodiment of the present invention.

FIG. 1 is a schematic diagram of a multi charged particle beam writing apparatus according to an embodiment of the present invention. In this embodiment, a configuration will be described in which an electron beam is used as an example of a charged particle beam. However, the charged particle beam is not limited to an electron beam, and may be another charged particle beam such as an ion beam.

The writing apparatus includes a writer W that radiates an electron beam to a substrate 24 as a writing target to write a desired pattern, and a controller C that controls the operation of the writer W.

The writer W includes an electron optical column 2 and a writing chamber 20. In the electron optical column 2, an electron source 4, an illumination lens 6, a shaping aperture array substrate 8, a blanking aperture array substrate 10, an acceleration lens 50, a limiting aperture member 14, two-stage objective lenses 16, 17, a magnetic correction lens 40, an electrostatic correction lens 60, and an electric field control electrode 70 are provided. The objective lenses 16, 17 are magnetic lenses.

Here, the "stage" of an objective lens means that a single imaging (image formation) is performed, and one-stage objective lens is comprised of a single lens in many cases; however, in order to reduce aberration and distortion, one-stage objective lens may be comprised of two or more magnetic lenses in proximity (in other words, a single imaging may be performed by two or more magnetic lenses in proximity).

The acceleration lens 50 is placed between the blanking aperture array substrate 10 and the objective lens 16. The acceleration lens 50 is an electrostatic lens comprised of a plurality of rotationally symmetric electrodes, and the electrode potential changes between an upstream intermediate potential and a downstream earth potential in the beam travel direction.

Although the limiting aperture member 14 is disposed between the acceleration lens 50 and the objective lens 16, a configuration may be adopted in which the limiting aperture member 14 is disposed between the objective lens 16 and the objective lens 17. The objective lens 17 is placed most downstream in the beam travel direction among the plurality of objective lenses provided in the writing apparatus. The objective lens 16 is placed upstream of the objective lens 17 in the beam travel direction. Because of such a positional relationship, the objective lens 16 may be called an upper-stage objective lens, and the objective lens 17 may be called a lower-stage objective lens. In addition, the objective lens 17 may be called a final-stage objective lens. The electrostatic correction lens 60 is placed within the lens magnetic field (i.e., inside the magnetic field, in the magnetic field) of the objective lens 16 comprised of a magnetic lens.

A region within lens magnetic field of the objective lens is a region where the magnetic flux density is high, and refers to, for example, the space surrounded by the magnetic poles of the objective lens. The magnetic field (on-axis magnetic flux density) of the objective lens attenuates as the distance from the objective lens magnetic poles increases. The on-axis magnetic flux density attains a maximum normally on the optical axis near the middle between a pair of magnetic poles (two magnetic poles) of the objective lens. Empirically, the region where the on-axis magnetic flux density is higher than $\frac{1}{10}$ its maximum value, for example, or the region where the magnetic flux density is higher than its local minimum can be regarded as "within the magnetic field".

In order to reduce aberration and distortion, one-stage objective lens may be comprised of two or more magnetic lenses in proximity, and in such a situation, even when a region with the magnetic flux density lower than or equal to $\frac{1}{10}$ or reaching a local minimum occurs between the magnetic lenses in proximity constituting one objective lens, the region is not regarded as the boundary between inside and outside of the lens magnetic field of the objective lens, but is regarded as "within magnetic field".

The electrostatic correction lens 60 generates a minute rotationally symmetric electrostatic field to correct the imaging state of the multi-beam. For example, the electrostatic correction lens 60 is comprised of a cylindrical electrode, to which a voltage for correction is applied. A cylindrical earth electrode may be placed above and below the electrode, to which a voltage is applied.

Note that a configuration may be adopted in which a cylindrical or ring-shaped electrode is divided (for example, an electrode is divided as in 8-pole deflector), and voltages for generating an electrostatic focusing field (rotationally symmetric electrostatic field), an electrostatic deflection field, and an electrostatic multipole field are added and applied to a group of these electrodes so that the group serves as a lens, a deflector, and a multipole. Since the configuration also generates an electrostatic field having a lens effect, such a group of electrodes is also included in one electrostatic correction lens.

The magnetic correction lens 40 is placed within the lens magnetic field of the lower-stage objective lens 17 comprised of a magnetic lens. The magnetic correction lens 40 generates a minute rotationally symmetric magnetic field to correct the imaging state. For example, the magnetic correction lens 40 is a circular coil or a solenoid coil having the beam optical axis as a central axis, and a current for correction is passed therethrough. In order not to disturb the magnetic field of the objective lens 17, the coil of the magnetic correction lens 40 is not surrounded by a magnetic material such as ferrite.

XY stage 22 is disposed in the writing chamber 20. The substrate 24 as a writing target is placed on the XY stage 22. The substrate 24 as a writing target is, for example, a mask blank or a semiconductor substrate (silicon wafer).

An electron beam 30 emitted from the electron source 4 illuminates the shaping aperture array substrate 8 substantially perpendicularly by the illumination lens 6. FIG. 2 is a conceptual diagram illustrating the configuration of the shaping aperture array substrate 8. In the shaping aperture array substrate 8, openings 80 in vertical (y direction) s rows×horizontal (x direction) t rows (s, t≥2) are formed in a matrix pattern with a predetermined arrangement pitch. For example, the openings 80 with 512 rows×512 rows are formed. The openings 80 are all formed in rectangular shapes having the same dimension. The openings 80 may be circular with the same diameter.

The electron beam 30 illuminates a region including all openings 80 of the shaping aperture array substrate 8. Part of the electron beam 30 passes through these multiple openings 80, thereby forming a multi-beam 30M as illustrated in FIG. 1.

In the blanking aperture array substrate 10, through-holes are formed corresponding to the arrangement positions of the openings 80 of the shaping aperture array substrate 8, and a blanker consisting of two electrodes as a pair is disposed in each through-hole. The multi-beam 30M passing through the through-holes are each independently deflected by a voltage applied to a corresponding blanker. Blanking control is performed on each beam by the deflection. In this manner, blanking deflection is performed by the blanking aperture array substrate 10 on each beam in the multi-beam 30M which has passed through the plurality of openings 80 of the shaping aperture array substrate 8.

An electrostatic field generated by the acceleration lens 50 is applied, as a focusing field, to the multi-beam 30M which has passed through the blanking aperture array substrate 10. The acceleration lens 50 reduces each beam size and arrangement pitch while increasing the acceleration energy of the multi-beam 30M, and forms a crossover CO1 slightly upstream of the objective lens 16. The limiting aperture member 14 is disposed so that the center of the opening formed in the limiting aperture member 14 substantially matches the crossover CO1. An electron beam deflected by a blanker of the blanking aperture array substrate 10 undergoes displacement in trajectory, deviates from the opening of the limiting aperture member 14, and is blocked by the limiting aperture member 14. In contrast, an electron beam not deflected by a blanker of the blanking aperture array substrate 10 passes through the opening of the limiting aperture member 14.

In this manner, the limiting aperture member 14 blocks those electron beams deflected by blankers of the blanking aperture array substrate 10 to achieve a beam-OFF state. The beam which has passed through the limiting aperture member 14 from beam ON to beam OFF provides the electron beam for a single shot.

The multi-beam 30M which has passed through the limiting aperture member 14 is affected by the upper-stage objective lens 16 to form a reduced intermediate image IS1 of the plurality of openings 80 of the shaping aperture array substrate 8, and to form a crossover CO2. The lower-stage objective lens 17 reduces the intermediate image IS1, and forms an image (beam array image) IS2 of the plurality of openings 80 of the shaping aperture array substrate 8 on the surface of the substrate 24, the image having a desired reduction ratio. Note that the reduction ratio is a reciprocal of magnification, and refers to the ratio of the size (or pitch) of the image formed on the surface of the substrate 24 to the size (or pitch) of the electron beam which is formed by part of the electron beam 30 passing through the plurality of openings 80 of the shaping aperture array substrate 8, for example.

Use of the objective lenses in two stages can achieve a high reduction ratio (for example, a magnification of approximately $\frac{1}{200}$) as well as secure the interval (working distance) by which the substrate 24 is movable between the lower surface of the final-stage lens (the objective lens 17) and the substrate 24.

The electron beams (the entire multi-beam) which have passed through the limiting aperture member 14 are collectively deflected by a deflector (not illustrated) in the same direction, and are radiated to the substrate 24. The deflector (not illustrated) may be disposed downstream of the blanking aperture array substrate 10, and disposing the deflector downstream of the upper-stage objective lens 16 is advantageous in reducing distortion and aberration. When the XY stage 22 moves continuously, the beams are deflected so that the beam irradiation position follows the movement of the XY stage 22. Also, the writing position changes every moment due to movement of the XY stage 22, and the surface height of the substrate 24 irradiated with the multi-beam changes. To cope with this, defocus of the multi-beam is dynamically corrected (dynamic focus) during writing by the later-described electrostatic correction lens 54 in the acceleration lens 50, magnetic correction lens 40, and electrostatic correction lens 60.

The multi-beam radiated at a time is ideally arranged with a pitch which is obtained by dividing (in other words, multiplying by a magnification) the arrangement pitch of the plurality of openings 80 of the shaping aperture array substrate 8 by the above-mentioned desired reduction ratio. The writing apparatus performs a raster-scan writing operation of continuously radiating a shot beam sequentially, and when a desired pattern is written, needed beams are controlled at beam-ON by blanking control according to a pattern.

During writing, the electric field control electrode 70 generates an electric field with a constant intensity on the surface of the substrate 24, and accelerates secondary electrons generated from the substrate 24 upstream. For example, the substrate 24 is set to the earth potential, a positive voltage Vs is applied to the electric field control electrode 70, and the applied voltage is maintained constant during writing. Because the secondary electrons have a negative electric charge, they are attracted from the substrate 24 in the direction of the electric field control electrode 70. The electric field strength is kept constant by maintaining the applied voltage constant.

The electric field control electrode 70 has an opening through which a beam passes. In order to reduce aberration and distortion of beam caused by an electric field generated by the electric field control electrode 70, the electric field control electrode 70 has an axial symmetric shape centered at the beam optical axis, and preferably has an annular shape as illustrated in FIG. 3A or a cylindrical shape as illustrated in FIG. 3B.

If the electric field control electrode 70 can control the electric field on the surface of the substrate 24, the arrangement location is not limited to a particular location, but the electric field control electrode 70 has a better electric field control performance with an arrangement location closer to the substrate 24. For example, the electric field control electrode 70 is placed at a height comparable to that of the magnetic poles (pole pieces) of the objective lens 17 or between the magnetic poles and the substrate 24, and is within the lens magnetic field of the objective lens 17 or downstream of the lens magnetic field. FIG. 3A illustrates an example in which the electric field control electrode 70 is placed at a height slightly downstream of a downstream magnetic pole 17*a* of the objective lens 17.

In order to obtain a sufficient imaging reduction ratio, the magnetic poles of the objective lens 17 are placed near the substrate 24. Thus, when the electric field control electrode 70 is placed at a height comparable to that of the magnetic poles of the objective lens 17 or between the magnetic poles and the substrate 24, the electric field control electrode 70 is placed within 20 mm from the surface of the substrate 24 in many cases.

As illustrated in FIG. 3C, an earth electrode 72 having the same potential as the substrate 24 may be provided downstream of the electric field control electrode 70. By providing the earth electrode 72, the electric field region from the electric field control electrode 70 to the substrate 24 can be limited to the vicinity of the beam optical axis. Limiting the electric field region can reduce the beam position variation due to movement of the substrate 24. Note that when the inner diameter of the downstream magnetic pole 17*a* of the objective lens 17 is small, the electric field control electrode 70 may be placed upstream of the downstream magnetic pole 17*a* so that the downstream magnetic pole 17*a* is provided with the function of the above-mentioned earth electrode 72.

A pattern for measuring the degree of positional deviation due to resist charging is written while successively changing the applied voltage, the degree of positional deviation is evaluated from a result of the writing, and the voltage Vs to be applied to the electric field control electrode 70 can be determined by selecting an applied voltage that provides a lower degree of positional deviation. As the method for evaluating the degree of positional deviation by a writing pattern, the methods described in JP 2009-260250 A and PTL 2 can be used.

The applied voltage providing a lower degree of positional deviation due to resist charging varies depending on the acceleration voltage of the electron beam, the configuration of the objective lenses, and the structure of the electric field control electrode 70 and its vicinity, but is normally, around 10 V to 200 V.

The controller C has a control computing machine 32 and a control circuit 34. The control computing machine 32 performs data conversion processes in multiple stages on writing data to generate shot data specific to the apparatus, and outputs the shot data to the control circuit 34. In the shot data, the irradiation amounts and irradiation position coordinates of shots are defined. The control circuit 34 determines an irradiation time by dividing the irradiation amount of each shot by a current density, and applies a deflection voltage to a corresponding blanker of the blanking aperture array substrate 10 so that when a relevant shot is performed, beam-ON is achieved only for the calculated irradiation time.

The control computing machine 32 holds data of later-described relational expression for coordination of the amounts of excitation (applied voltage for the electrostatic correction lens, excitation current for the magnetic correction lens) of the electrostatic correction lens 54 in the acceleration lens 50, electrostatic correction lens 60, and magnetic correction lens 40, and calculates the amount of excitation of each correction lens using the relational expression. The control circuit 34 controls the amounts of excitation of the electrostatic correction lenses 54, 60 and the magnetic correction lens 40 based on the result of the calculation.

In addition, the control circuit 34 applies the constant voltage Vs to the electric field control electrode 70 during writing, and generates a secondary electron lifting electric field on the surface of the substrate 24.

Figures 4A, 4B, 4C:
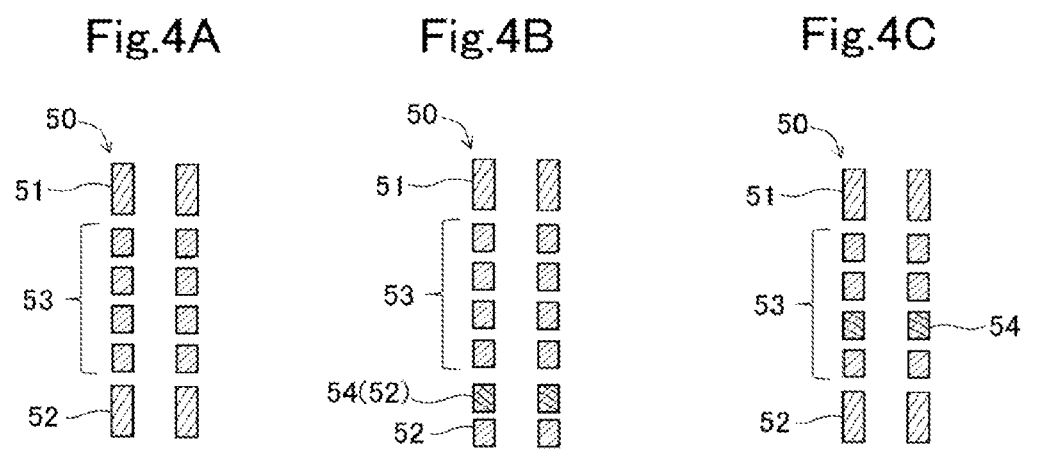

As illustrated in FIG. 4A, the acceleration lens 50 has a plurality of cylindrical or ring-shaped electrodes 51, 52, 53. The same voltage (electrical potential) as that of the shaping aperture array substrate 8, the blanking aperture array substrate 10 is applied to an intermediate potential electrode 51 located upstream. The earth potential is applied to an earth electrode 52 located downstream. For example, when an electron beam, negatively charged, is accelerated, −45 kV is applied to the intermediate potential electrode 51, and the earth electrode 52 is at 0 V.

A voltage is applied to a plurality of electrodes 53 located between the intermediate potential electrode 51 and the earth electrode 52, the voltage being optimized so that aberration and distortion are reduced in a range where the potential difference between adjacent electrodes does not exceed a withstand voltage. Normally, the intermediate potential electrode 51 and the earth electrode 52 are longer in length than the electrode 53 (in the beam travel direction).

In this embodiment, part of the electrodes of the acceleration lens 50 is equipped with the function, as the electrostatic correction lens, of correcting the imaging state of the multi-beam. In other words, part of the electrodes of the acceleration lens 50 also serves as the electrostatic correction lens 54.

For example, as illustrated in FIG. 4B, the earth electrode 52 is divided into halves in the cylindrical axis direction, and an upstream earth electrode 52 is operated as the electrostatic correction lens 54 by applying a correction voltage to the upstream earth electrode 52. The earth potential is applied to the upstream earth electrode 52 when it is not used for correction of the imaging state of the multi-beam.

Alternatively, as illustrated in FIG. 4C, a voltage for the acceleration lens and a correction voltage may be added and applied to at least one of the plurality of electrodes 53, thus the at least one electrode 53 may be operated as the electrostatic correction lens 54.

The beam acceleration capability of the acceleration lens 50 is determined by the electrical potential at the entrance of the acceleration lens, and the electrical potential at the exit of the acceleration lens. The configuration illustrated in FIG. 4B, FIG. 4C is the same as the configuration illustrated in FIG. 4A in the most upstream entrance electrode potential and the most downstream exit electrode potential, thus even when a correction voltage is added to the applied voltage of part of the electrodes so that the part is operated as the electrostatic correction lens 54, the beam acceleration capability remains the same.

Note that as in a configuration in which a cylindrical or ring-shaped electrode is divided (for example, an electrode is divided as in 8-pole deflector), and voltages for generating a rotationally symmetric electrostatic field (having a focusing effect and an acceleration effect), an electrostatic deflection field, and an electrostatic multipole field are added and applied to a group of these electrodes, the group of the electrodes for generating a rotationally symmetric electrostatic field components is also regarded as one electrode included in the acceleration lens.

When a correction voltage is applied to the electrode which is operated as the electrostatic correction lens 54, a change occurs in the total lens effect (beam focusing capability) of the acceleration lens and the electrostatic correction lens. As a result, the imaging height of the intermediate image IS1 and the magnification change. The later-stage objective lens 17 forms a reduced image of the intermediate image IS1, thus change in the imaging height occurred in the intermediate image IS1 is reduced, and change in the imaging height of beam array image IS2 on the surface of the substrate 24 is decreased. In other words, the electrostatic correction lens 54 has an imaging height correction sensitivity to some degree, but the sensitivity is low. The change in the magnification (ratio of magnification) occurred in the intermediate image IS1 is transferred to magnification change of the beam array image IS2 as it is regardless of the imaging magnification of the later-stage objective lens 17, thus the magnification correction sensitivity of the electrostatic correction lens 54 is high. A combination of the electrostatic lens and the electrostatic correction lens does not cause rotation of an image, thus the rotation correction sensitivity of the electrostatic correction lens 54 is extremely low.

As described above, the electrostatic correction lens 54 that also serves as an electrode of the acceleration lens 50 has a high magnification correction sensitivity, a low imaging height correction sensitivity, and an extremely low rotation correction sensitivity.

The electrostatic lens placed in the magnetic field of the objective lens (magnetic lens) changes the energy of the beam in the electrostatic lens to change the focusing effect of the beam received from the magnetic lens, thus changes the imaging height. The change of the focusing effect also causes magnification change. Normally, no rotation occurs in the electrostatic lens alone, but when placed in a lens magnetic field, rotation also changes by a magnetic lens effect due to an energy change. Because the magnetic field generated by the objective lens to form an image of the beam is extremely intense, for a small energy change due to a tiny change in the applied voltage of the electrostatic lens, the focusing effect and the rotational effect of the entire lens magnetic field is significantly changed.

Therefore, the electrostatic correction lens 60 has high imaging height correction sensitivity, magnification correction sensitivity, and rotation correction sensitivity to the intermediate image IS1. However, the final-stage objective lens 17 reduces the intermediate image IS1 to form an image, thus the change in the height direction is reduced. As a result, some degree of sensitivity is achieved for the imaging height correction to the beam array image IS2 on the surface of the substrate 24, but the sensitivity is low. However, the magnification change (ratio of magnification) and rotation remain the same. Therefore, the electrostatic correction lens 60 placed in the lens magnetic field of the objective lens 16 has a low correction sensitivity to the imaging height, but has a high correction sensitivity to magnification and rotation.

The magnetic correction lens has an effect (rotational effect) of rotating a beam image, and the effect occurs regardless of whether the position of the magnetic correction lens in the optical axis direction is inside or outside the magnetic field of the objective lens. Because rotation of an image is simple sum of the rotational effect of the objective lens magnetic field and the rotational effect of the magnetic correction lens magnetic field, and even when both magnetic fields overlap, no synergetic effect (rotational effect proportional to the product of both magnetic fields) occurs.

When a magnetic correction lens is placed in a lens magnetic field, the sensitivity to the imaging height correction increases, and accordingly, the magnification correction effect also increases. This is because the focusing capability of the lens magnetic field is proportional to square of the on-axis magnetic flux density, thus overlap between the magnetic field of the objective lens and the magnetic field of the magnetic correction lens in the optical axis direction causes a synergetic effect (focusing effect proportional to the product of both magnetic fields) to occur, and a significant change in the focusing capability is obtained for a small change in the correction lens magnetic field.

Therefore, as in this embodiment, the magnetic correction lens 40 placed in the lens magnetic field of the lower-stage objective lens 17 has characteristics that the correction sensitivity for all of imaging height, magnification and rotation is high.

Note that the magnetic correction lens 40 can apply a magnetic field from the outside of the electric field control electrode 70, thus no arrangement interference (interference of location) occurs between the magnetic correction lens 40 and the electric field control electrode 70. The electric field control electrode 70 has no effect on the magnetic field generated by the magnetic correction lens 40. In addition, the magnetic correction lens 40 has no effect on the electric field generated by the electric field control electrode 70. Thus, the magnetic correction lens 40 and the electric field control electrode 70 can be placed at the same position or positions (heights) in proximity in the beam travel direction.

As described above, the electrostatic correction lens 54 also serving as an electrode of the acceleration lens 50, the electrostatic correction lens 60 placed in the lens magnetic field of the upper-stage objective lens 16, and the magnetic correction lens 40 placed in the lens magnetic field of the lower-stage objective lens 17 have different correction characteristics (ratio of the imaging height correction sensitivity, the magnification correction sensitivity, and the rotation correction sensitivity is different), thus a mutual relationship between the amounts of excitation (applied voltage, excitation current) of these three correction lenses is set, and the amounts of excitation are controlled in coordination with each other by an appropriate relational expression, thereby making it possible to correct the imaging state as follows.

The imaging height is changed corresponding to a variation in the surface height of the substrate with a magnification unchanged and no rotation.

The magnification is changed with a constant surface height of the substrate, no rotation and an imaging height unchanged.

The rotation is changed with a constant surface height of the substrate, an imaging height unchanged and a magnification unchanged.

The first correction of the above-mentioned three types of correction to the imaging state is utilized in focus correction (dynamic focus) performed during writing so as to correspond to the irregularities of the sample surface. The second correction can be utilized for fine adjustment of the magnification, and the third correction can be utilized for fine adjustment of rotation.

The relational expression in coordination with the amounts of excitation in correction of the imaging state is different in each of the above-mentioned three patterns of adjustment. When a first or higher degree polynomial of adjustment amounts (imaging height, magnification, rotation) is used as the relational expression between the amounts of excitation, adjustment is possible with sufficient accuracy. The coefficients of the polynomial are determined by a trajectory simulation. The coefficients may be calculated based on the measured dependence of the imaging height, magnification, rotation on the amounts of excitation.

According to this embodiment, as described above, a constant intensity electric field, which prevents the secondary electrons from returning to the substrate 24, is generated on the substrate 24 by the electric field control electrode 70 during writing, thus change in the amount of charge of the resist is prevented, and the writing accuracy can be improved.

When an electrostatic correction lens is attempted to be placed in the magnetic field of the objective lens 17 on the near side of a sample as in the configuration (see, for example, PTL 1) of a conventional correction lens, a problem may arise in that interference of location with the electric field control electrode 70 occurs, and either one of the electric field control electrode 70 or the electrostatic correction lens cannot be placed. Or even if placement is possible, the electric field control electrode 70 and the electrostatic correction lens are placed in extreme proximity, and a problem arises in that the electric field of the electrostatic correction lens which changes during writing comes up to the substrate 24, and the electric field cannot be maintained at a constant intensity during writing, thus the writing accuracy deteriorates. Furthermore, a problem arises in that during a write operation, when the voltage (electrical potential) of the electrode placed upstream reduces, which is one of the electric field control electrode 70 and the electrostatic correction lens electrode in the magnetic field of the objective lens 17, the secondary electrons from the substrate 24 are decelerated near the boundary between both electrodes, and stay in the vicinity of the beam trajectory with a high density, thus the Coulomb force from the staying secondary electrons changes the beam trajectory, which causes the writing accuracy to deteriorate. However, in this embodiment, since it is a magnetic correction lens that is placed in the magnetic field of the final-stage objective lens and electrostatic correction lenses are placed upstream of the magnetic field of the final-stage objective lens, such a problem does not occur, and the imaging state can be corrected by the focus correction lens while maintaining the electric field on the substrate 24 at a constant intensity during writing. Thus the writing accuracy can be improved.

In the above embodiment, the electric field control electrode 70 may be set to the earth potential, and a negative voltage may be applied to the substrate 24, then a secondary electron lifting electric field may be generated with a constant voltage applied during writing. Due to the generated electric field, the secondary electrons are attracted from the substrate 24 in the direction (upstream direction) to the electric field control electrode 70.

Alternatively, a negative constant voltage may be applied to the substrate 24, and the downstream magnetic poles 17a of the objective lens 17 may be set to the earth potential so that the function of the electric field control electrode be provided.

Figure 5:
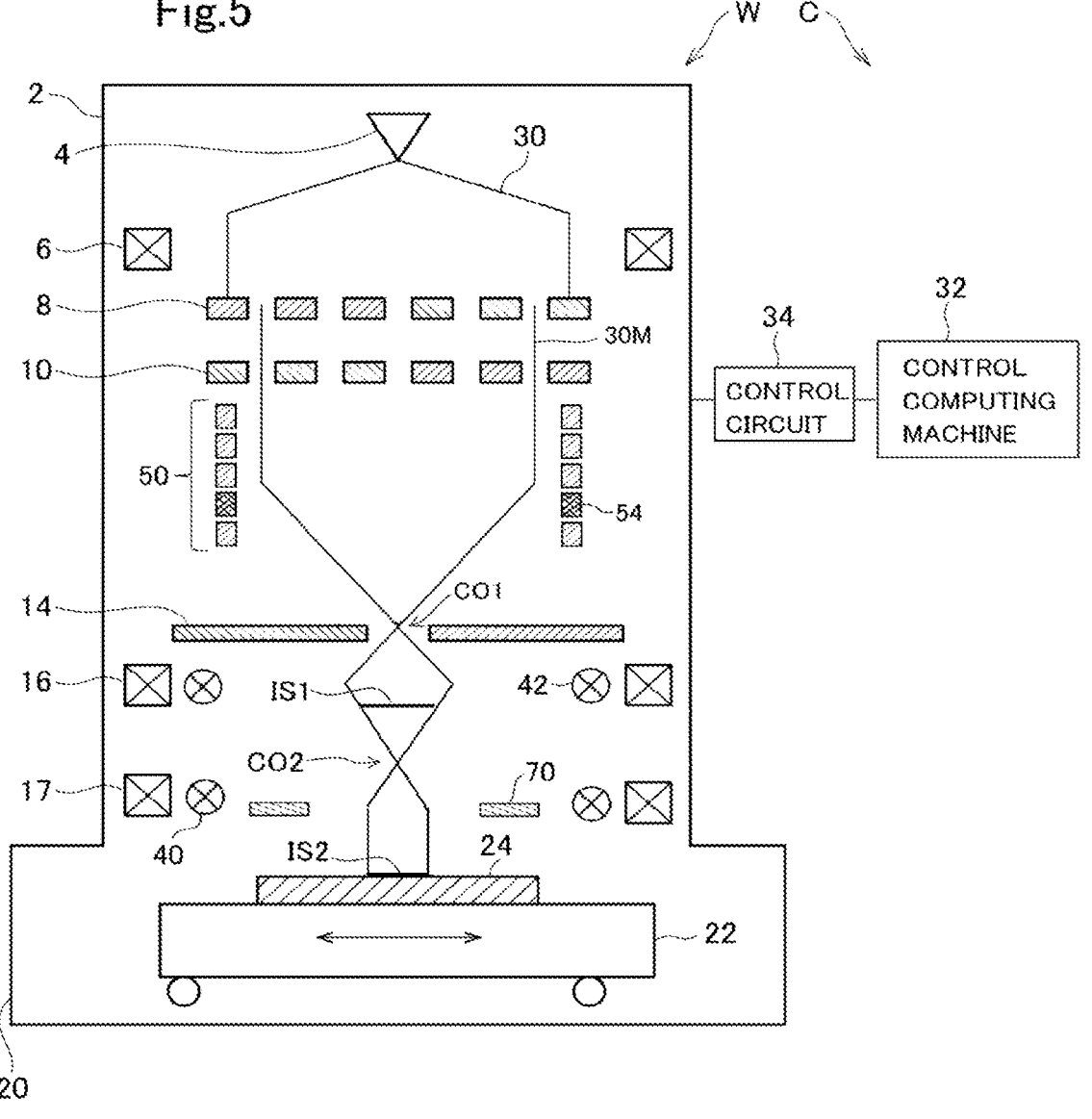
FIG. 5 is a schematic diagram of a multi charged particle beam writing apparatus according to another embodiment.

In the writing apparatus illustrated in FIG. 1, the electrostatic correction lens 60 is placed in the lens magnetic field of the objective lens 16; however, as illustrated in FIG. 5, the electrostatic correction lens 60 may be removed, and the magnetic correction lens 42 may be placed in the lens magnetic field of the objective lens 16.

The magnetic correction lens 42 placed in the magnetic field of the objective lens 16 has some degree of imaging height correction sensitivity but the sensitivity is low because the imaging height correction amount is reduced by the later-stage objective lens 17. The magnification correction effect is not affected by the later-stage lens, and high. In addition, the magnetic correction lens has a high rotation correction sensitivity regardless of inside or outside the magnetic field of the objective lens. Therefore, the magnetic correction lens 42 placed in the lens magnetic field of the objective lens 16 has a low correction sensitivity to the imaging height, but has a high correction sensitivity to magnification and rotation.

Thus, the amounts of excitation of the electrostatic correction lens 54 and the magnetic correction lenses 40, 42 all having different correction characteristics are controlled in coordination with each other based on a relational expression, thereby making it possible to correct the imaging state in the same manner as in the above embodiment.

Figure 6:
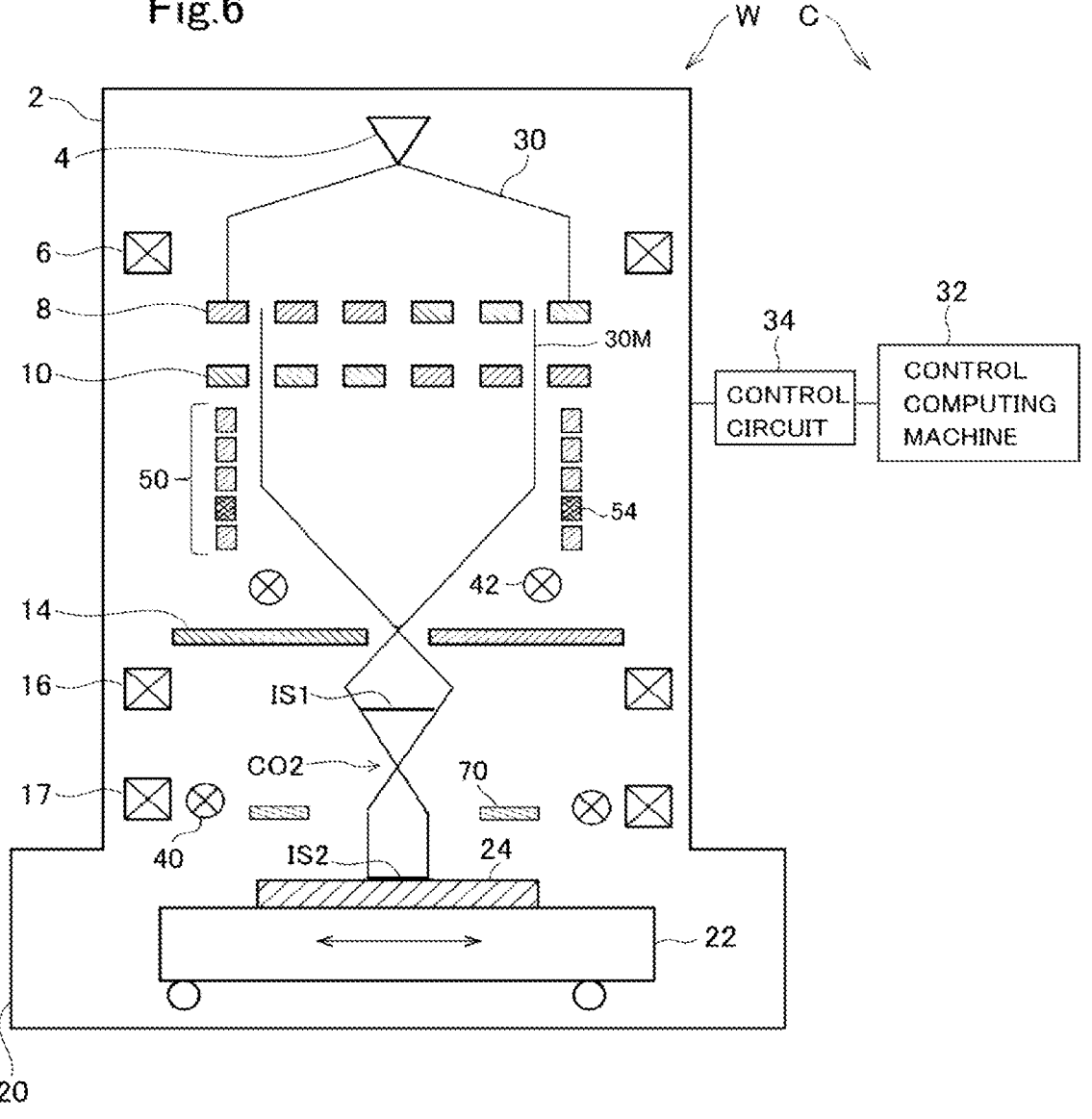
FIG. 6 is a schematic diagram of a multi charged particle beam writing apparatus according to another embodiment.

The magnetic correction lens 42 may be placed not inside the lens magnetic field of the objective lens 16, but outside the lens magnetic field of the objective lenses 16, 17. For example, as illustrated in FIG. 6, the magnetic correction lens 42 is placed outside the lens magnetic field upstream of the objective lenses 16, 17. In the magnetic correction lens 42 placed outside the lens magnetic field, the coil may be surrounded by a magnetic material such as ferrite.

The magnetic field (on-axis magnetic flux density) of a magnetic objective lens attenuates as the distance from the objective lens magnetic poles increases. Empirically, the region where the on-axis magnetic flux density is lower than or equal to $\frac{1}{10}$ its maximum value can be regarded as "outside the magnetic field".

In this embodiment, the magnetic correction lens 42 is placed between the acceleration lens 50 and the objective lens 16, but the position of the magnetic correction lens 42 may be outside the magnetic field of the objective lenses 16, 17, and downstream of the blanking aperture array substrate 10. For example, a coil may be disposed to surround the acceleration lens 50, and the coil may be used as the magnetic correction lens 42.

When the magnetic correction lens is placed outside the lens magnetic field, change of the focusing capability is extremely small, and correction sensitivity to the imaging height and magnification is extremely reduced. Therefore, the magnetic correction lens 42 placed outside the lens magnetic field of the objective lenses 16, 17 has characteristics that the correction sensitivity to the imaging height and magnification is extremely low, and the rotation correction sensitivity is high.

Thus, the amounts of excitation of the electrostatic correction lens 54 and the magnetic correction lenses 40, 42 all having different correction characteristics are controlled in coordination with each other based on a relational expression, thereby making it possible to correct the imaging state in the same manner as in the above embodiment.

Figure 7:
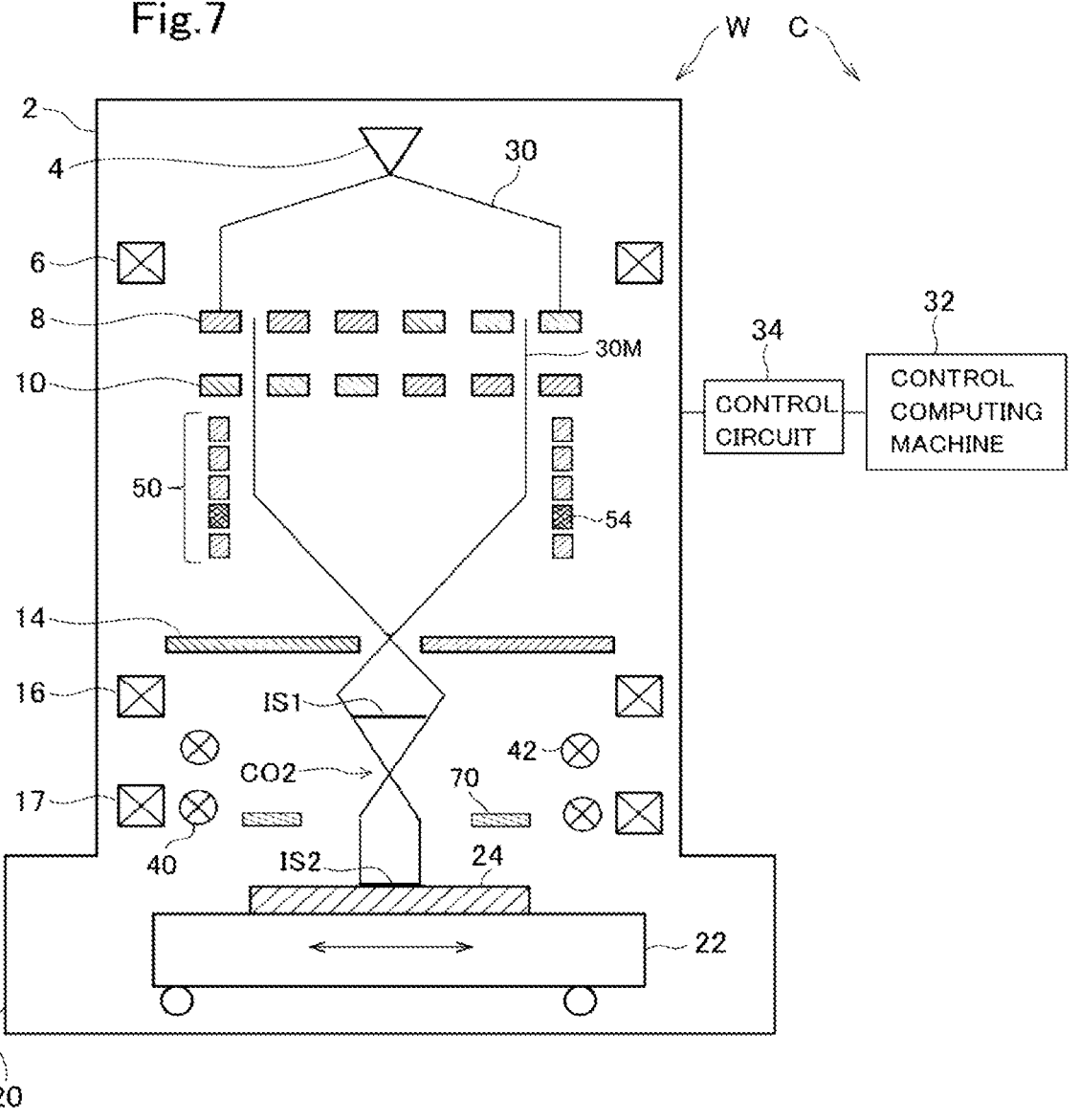
FIG. 7 is a schematic diagram of a multi charged particle beam writing apparatus according to another embodiment.

The position of the magnetic correction lens 42 is not limited to the outside the lens magnetic field, upstream of the objective lenses 16, 17, and as illustrated in FIG. 7, the magnetic correction lens 40 may be placed between the two-stage objective lenses 16, 17 outside the lens magnetic field.

For example, when two objective lenses 16, 17 have opposite excitation directions (directions of the magnetic focusing field), a position occurs where the magnetic flux density is 0 between both lenses, thus the magnetic correction lens 42 is placed near the position.

Even when two objective lenses 16, 17 have the same excitation direction, a region (for example, a region where the on-axis magnetic flux density is lower than or equal to $\frac{1}{10}$ its maximum value) often occurs where the magnetic flux density sufficiently attenuates between both lenses, thus the magnetic correction lens 42 is placed near the region.

Of the three correction lenses to be used for correction of the imaging state of the multi-beam, two correction lenses placed upstream (outside) of the lens magnetic field of the objective lens 17 in the beam travel direction can be combined in various ways in configuration and arrangement position.

Figure 8:
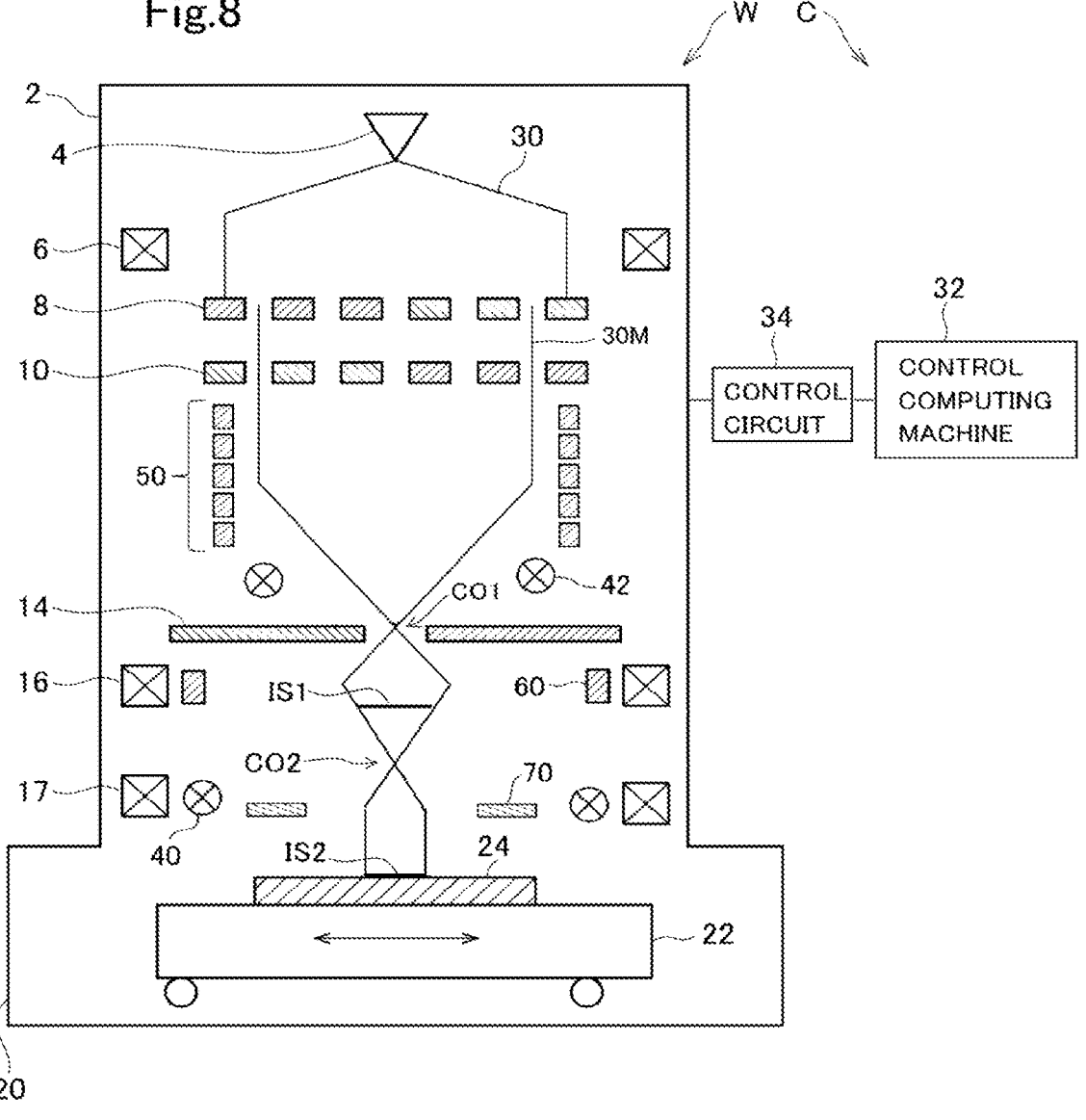
FIG. 8 is a schematic diagram of a multi charged particle beam writing apparatus according to another embodiment.

For example, as illustrated in FIG. 8 the imaging state of the multi-beam may be corrected using the magnetic correction lens 42 placed outside the lens magnetic field, which is between the acceleration lens 50 and the objective lens 16, and upstream of the objective lenses 16, 17, the electrostatic correction lens 60 placed in the lens magnetic field of object lens 16, and the magnetic correction lens 40 placed in the lens magnetic field of the objective lens 17. In this example, any electrode of the acceleration lens 50 is not utilized as an electrostatic correction lens.

In the writing apparatus illustrated in FIG. 8, instead of the electrostatic correction lens 60, a magnetic correction lens may be placed in the lens magnetic field of the objective lens 16. The position of the magnetic correction lens 42 may be outside the lens magnetic field between the two-stage objective lenses 16, 17.

Figure 9:
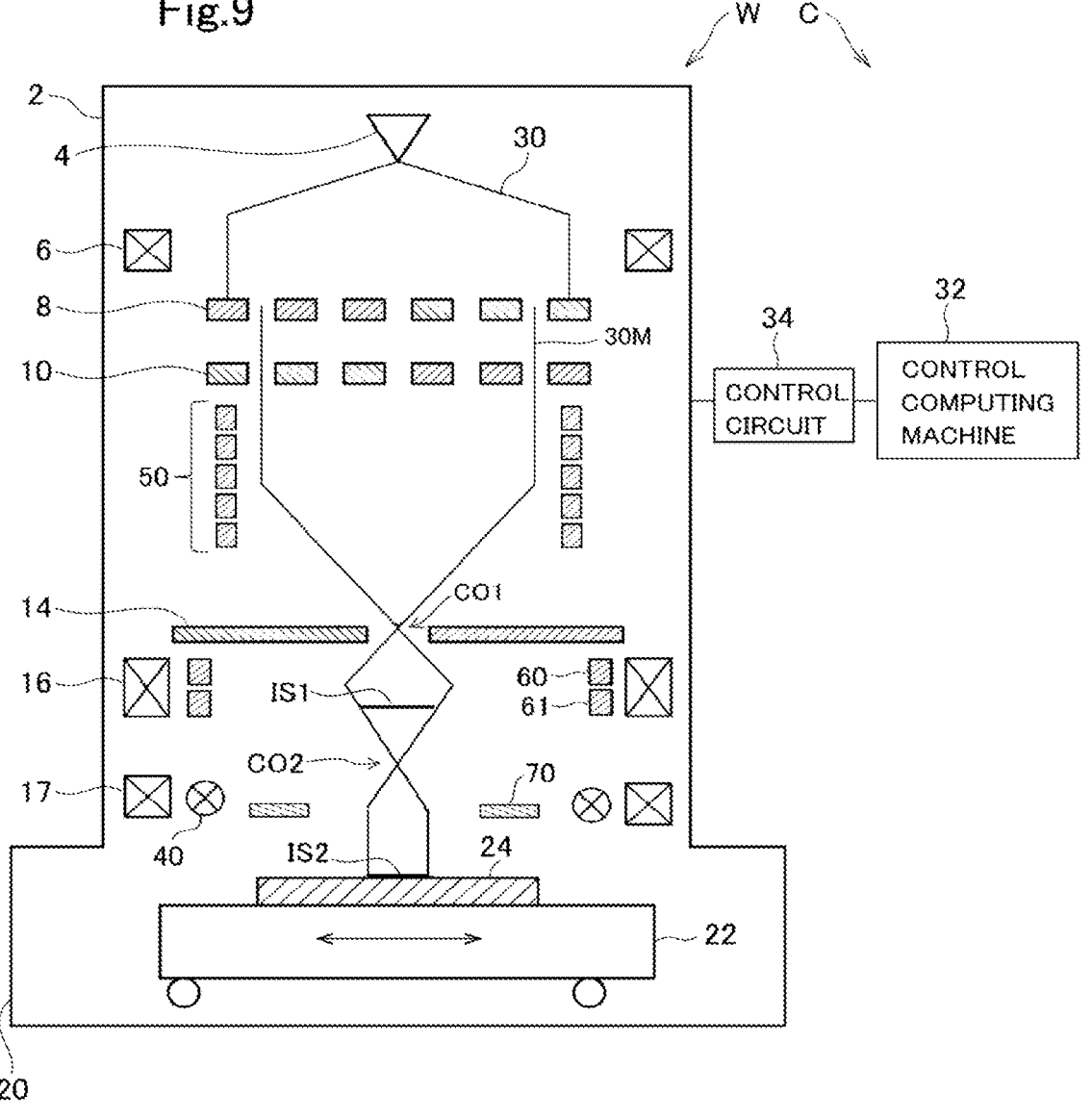
FIG. 9 is a schematic diagram of a multi charged particle beam writing apparatus according to another embodiment.

As illustrated in FIG. 9, the imaging state of the multi-beam may be corrected using the electrostatic correction lenses 60, 61 placed in the lens magnetic field of the objective lens 16, and the magnetic correction lens 40 placed in the lens magnetic field of the objective lens. In this example, any electrode of the acceleration lens 50 is not utilized as an electrostatic correction lens.

In the writing apparatus illustrated in FIG. 9, the two correction lenses to be placed in the lens magnetic field of the objective lens 16 may be one electrostatic correction lens and one magnetic correction lens, or two magnetic correction lenses.

When the correction sensitivity of each of the correction lenses in the objective lens magnetic field is studied in detail, the correction sensitivity other than the rotation correction sensitivity of the magnetic correction lens depends on the objective lens magnetic field intensity (magnetic flux density) at the correction lens position, and the beam trajectory value (distance from the optical axis) at the correction lens position. In addition, the dependence is different according to which correction sensitivity (one of the imaging height correction sensitivity, the magnification correction sensitivity, and the rotation correction sensitivity). Therefore, even in the lens magnetic field of the same objective lens 16, if the positions of two correction lenses are shifted and placed in the beam optical axis direction, the magnetic field intensities and trajectory values at the positions are different, thus different correction sensitivities are obtained. As a result, in the writing apparatus illustrated in FIG. 9, the amounts of excitation of the correction lenses are controlled in coordination with each other based on a relational expression, thereby making it possible to correct the imaging state in the same manner as in the writing apparatus of FIG. 1.

Note that when a plurality of electrostatic correction lenses are placed in the magnetic field of an objective lens, an occurrence of a potential difference between electrostatic correction lenses in proximity causes secondary electrons to stay near the boundary between the electrostatic correction lenses, thus the beam position may become unstable due to the Coulomb force from the staying secondary electrons. However, as in the writing apparatus illustrated in FIG. 9, when placement is made in the magnetic field of the objective lens 16, the secondary electrons from the substrate 24 pass through the magnetic field of the lower-stage objective lens 17, then diffuse and scatter, thus reduced number of secondary electrons reach the magnetic field of the upper-stage objective lens 16, therefore instability of the beam position is small, which causes no problem in most cases. When instability of the beam position causes a problem, magnetic correction lenses may serve as part or all of the correction lenses as described above.

In the writing apparatus presented so far, a configuration using three correction lenses has been described; however, the imaging state may be corrected using n (n is an integer greater than or equal to 3) correction lenses.

In addition, m (m is an integer such that n≥m≥1) magnetic correction lenses may be placed in the magnetic field of the lower-stage objective lens 17. In this case, (n−m) correction lenses that are the n correction lenses other than the m magnetic correction lenses placed in the magnetic field of the objective lens 17 are placed upstream of the magnetic field of the objective lens 17 in the beam travel direction.

In the writing apparatus presented so far, a configuration using two-stage objective lenses has been described; however, even when three or more-stage objective lenses are used, the imaging state can be corrected while generating a constant electric field to lift secondary electrons during writing, thus the writing accuracy can be improved.

Although the present invention has been described in detail with reference to particular embodiments, it will be apparent to those skilled in the art that various modifications may be made therein without departing from the spirit and scope of the present invention.

REFERENCE SIGNS LIST

2 ELECTRON OPTICAL COLUMN
4 ELECTRON SOURCE
6 ILLUMINATION LENS
8 SHAPING APERTURE ARRAY SUBSTRATE
10 BLANKING APERTURE ARRAY SUBSTRATE
14 LIMITING APERTURE MEMBER
16, 17 OBJECTIVE LENS
20 WRITING CHAMBER
22 XY STAGE
24 SUBSTRATE
40 MAGNETIC CORRECTION LENS
50 ACCELERATION LENS
60 ELECTROSTATIC CORRECTION LENS
70 ELECTRIC FIELD CONTROL ELECTRODE

The invention claimed is:

1. A multi charged particle beam writing apparatus comprising:

a plurality of blankers performing blanking deflection on each of beams in a multi charged particle beam;

a limiting aperture member blocking a beam in the multi charged particle beam, the beam being deflected by the blanker to achieve a beam-off state;

two or more-stage objective lenses each comprised of a magnetic lens, and configured to focus the multi charged particle beam on a substrate, which has passed through the limiting aperture member;

n (n is an integer greater than or equal to three) correction lenses correcting an imaging state of the multi charged particle beam on the substrate; and an electric field control electrode to which a positive constant voltage with respect to the substrate is applied, the electric field control electrode generating an electric field between the substrate and the electric field control electrode, wherein the two or more-stage objective lenses include a first objective lens, and a second objective lens placed most downstream in a travel direction of the multi charged particle beam, m (m is an integer such that n≥m≥1) correction lenses of the n correction lenses are magnetic correction lenses placed in a lens magnetic field of the second objective lens, and (n−m) correction lenses that are the n correction lenses other than the magnetic correction lenses are placed upstream of the lens magnetic field of the second objective lens in the travel direction of the multi charged particle beam.

2. The multi charged particle beam writing apparatus according to claim 1, wherein the electric field control electrode is disposed in the lens magnetic field of the second objective lens or downstream of the lens magnetic field of the second objective lens in the travel direction of the multi charged particle beam.

3. The multi charged particle beam writing apparatus according to claim 1, further comprising an acceleration lens including an electrostatic lens having a plurality of electrodes, the acceleration lens accelerating the multi charged particle beam, wherein the (n−m) correction lenses include an electrostatic correction lens that also serves as the electrode of the acceleration lens.

4. The multi charged particle beam writing apparatus according to claim 1, wherein the (n−m) correction lenses include an electrostatic correction lens or a magnetic correction lens which is placed in a lens magnetic field of the first objective lens.

5. The multi charged particle beam writing apparatus according to claim 1, wherein the (n−m) correction lenses include a magnetic correction lens placed outside a lens magnetic field of the two or more-stage objective lenses.

6. The multi charged particle beam writing apparatus according to claim 5, wherein the magnetic correction lens placed outside the lens magnetic field is placed upstream of the lens magnetic field of the two or more-stage objective lenses in the travel direction of the multi charged particle beam or between the lens magnetic field of the two or more-stage objective lenses.

7. The multi charged particle beam writing apparatus according to claim 1, wherein a mutual relationship between amounts of excitation of the n correction lenses is set, and the imaging state of the multi charged particle beam is corrected.

8. The multi charged particle beam writing apparatus according to claim 7, wherein the correction of the imaging state is such that an imaging height is changed with a magnification unchanged and no rotation.

9. The multi charged particle beam writing apparatus according to claim 7, wherein the correction of the imaging state is such that magnification is changed with no rotation and an imaging height unchanged.

10. The multi charged particle beam writing apparatus according to claim 7, wherein the correction of the imaging state is such that rotation is changed with an imaging height unchanged and a magnification unchanged.

* * * * *